(12) United States Patent
Shigeoka (10) Patent No.: US 11,990,310 B2
(45) Date of Patent: May 21, 2024

(54) RADIATION GENERATION APPARATUS AND RADIATION GENERATION METHOD

(71) Applicant: MITSUBISHI HEAVY INDUSTRIES MACHINERY SYSTEMS, LTD., Hyogo (JP)

(72) Inventor: Nobuyuki Shigeoka, Hyogo (JP)

(73) Assignee: MITSUBISHI HEAVY INDUSTRIES MACHINERY SYSTEMS, LTD., Kobe (JP)

( * ) Notice: Subject to any disclaimer, the term of this patent is extended or adjusted under 35 U.S.C. 154(b) by 303 days.

(21) Appl. No.: 17/427,961

(22) PCT Filed: Dec. 17, 2019

(86) PCT No.: PCT/JP2019/049428
§ 371 (c)(1),
(2) Date: Aug. 3, 2021

(87) PCT Pub. No.: WO2020/162050
PCT Pub. Date: Aug. 13, 2020

(65) Prior Publication Data
US 2022/0130635 A1 Apr. 28, 2022

(30) Foreign Application Priority Data
Feb. 6, 2019 (JP) ................. 2019-020072

(51) Int. Cl.
*H01J 37/073* (2006.01)
*H05H 7/02* (2006.01)
*H05H 7/18* (2006.01)

(52) U.S. Cl.
CPC ............ *H01J 37/073* (2013.01); *H05H 7/02* (2013.01); *H05H 7/18* (2013.01); *H05H 2007/025* (2013.01)

(58) Field of Classification Search
CPC .. H05H 7/02; H05H 1/01; H05H 1/02; H05H 2007/025; H05H 1/0006
See application file for complete search history.

(56) References Cited

U.S. PATENT DOCUMENTS 4,833,482 A * 5/1989 Trinh ...................... H01Q 21/24
343/700 MS
5,367,307 A * 11/1994 Dupuis ................ H01Q 21/065
343/731
(Continued)

FOREIGN PATENT DOCUMENTS

CN 105309051 A 2/2016
CN 108432350 A 8/2018
(Continued)

OTHER PUBLICATIONS

Author: Mitsubishi Heavy Industries Mechatronics Systems Ltd WO2017/110700A1,Date Jun. 29, 2017 (Year: 2017).*
(Continued)

*Primary Examiner* — Wei (Victor) Y Chan
(74) *Attorney, Agent, or Firm* — HAUPTMAN HAM, LLP (57) ABSTRACT

Provided is a radiation generation apparatus that can be downsized while improving power efficiency compared with a normal conduction accelerating tube. The radiation generation apparatus includes: an accelerating tube in which an accelerating cavity is defined by a tubular-shaped housing having conductivity and a plurality of cells made of a dielectric material, center openings of the cells being aligned so as to be communicated with each other in a direction in which the cells are arranged in the housing; an RF amplifier that supplies a high-frequency power to the accelerating tube; and an electron gun that emits a charged particle passing through the opening of each of the cells in the accelerating tube.

6 Claims, 5 Drawing Sheets

(56) References Cited

U.S. PATENT DOCUMENTS

| | | | |
|---|---|---|---|
| 6,424,298 B1* | 7/2002 | Nishikawa | H01Q 21/065 343/700 MS |
| 8,558,745 B2* | 10/2013 | Habib | H01Q 1/38 343/753 |
| 9,385,770 B2* | 7/2016 | Moeller | H04B 1/406 |
| 9,705,196 B2* | 7/2017 | Okunaga | H01Q 21/0075 |
| 9,775,228 B2 | 9/2017 | Abs | |
| 10,440,809 B2 | 10/2019 | Yoshida et al. | |
| 2012/0081041 A1 | 4/2012 | Cheung et al. | |
| 2012/0294423 A1 | 11/2012 | Cheung et al. | |
| 2013/0332116 A1* | 12/2013 | Suzuki | H01J 37/285 702/191 |
| 2016/0113104 A1 | 4/2016 | Abs | |
| 2017/0265291 A1 | 9/2017 | Nighan, Jr. et al. | |
| 2018/0199904 A1 | 7/2018 | Ganguly et al. | |
| 2019/0014653 A1 | 1/2019 | Yoshida et al. | |

FOREIGN PATENT DOCUMENTS

| | | |
|---|---|---|
| JP | 06231900 A | 8/1994 |
| JP | 2002141195 A | 5/2002 |
| JP | 2002229498 A | 8/2002 |
| JP | 2002305098 A | 10/2002 |
| JP | 2017117730 A | 6/2017 |
| WO | 2017110700 A1 | 6/2017 |

OTHER PUBLICATIONS

Author:Mitsubishi Electric Corporation JP2002141195A, Date :May 17, 2002 (Year: 2002).*

Author:Mitsubishi Electric Corporation JP2002305098A, Date : Oct. 18, 2002 (Year: 2002).*

Office Action for Chinese Application No. 201980091084.5 dated Mar. 30, 2023; 13pp.

International Search Report and Written Opinion of International Application No. PCT/JP2019/049428 dated Mar. 17, 2020; 13pp.

Office Action for Japanese Application No. 2019-020072 dated Sep. 27, 2022; 5pp.

* cited by examiner

RADIATION GENERATION APPARATUS AND RADIATION GENERATION METHOD

RELATED APPLICATIONS

The present application is a National Phase of International Application No. PCT/JP2019/049428 filed Dec. 17, 2019 and claims priority to Japanese Application Number 2019-020072 filed Feb. 6, 2019.

FIELD

The present invention relates to a radiation generation apparatus and a radiation generation method.

BACKGROUND

X-rays (radiations) are used for nondestructive inspection in industrial field, inspection in medical field, radiation therapy, or the like. X-rays may be produced as bremsstrahlung radiation (for example, energy of about 100 keV) by irradiating a target with accelerated electrons. For example, as in a fluoroscopic image of a human body, when the density of the object to be inspected is relatively low, or when the thickness of the object to be inspected is relatively thin, an X-ray tube using the above-described bremsstrahlung radiation is applicable.

For example, Patent Literature 1 discloses an accelerating cavity and an accelerator (accelerating tube) capable of reducing conduction loss and improving power efficiency by storing most of the high-frequency power to be converted into acceleration energy in a dielectric material with small high-frequency loss.

CITATION LIST

Patent Literature

Patent Literature 1: Japanese Patent Application Laid-open No. 2017-117730

SUMMARY

Technical Problem

The penetrating power of the X-rays produced in the X-ray tube described above is not sufficient, when the density of the object to be inspected is high and when the thickness of the object to be inspected in the penetrating direction is thick. As a result, the image contrast may not be good enough to obtain sufficient information.

Gamma-rays produced by a radioisotope such as Ir-192 have a high penetrating power compared with the bremsstrahlung radiation with energy of about 100 keV described above. However, compared with the X-ray tube that stops producing X-rays when the power source supply is interrupted, the radioisotope requires more careful handling.

Moreover, a normal conduction accelerating tube using a resonant cavity made of oxygen-free copper has been generally used. In the normal conduction accelerating tube, the energy of X-rays is high (1 MeV or more), and the penetrating power is high. However, to output electrons with an average current capable of obtaining X-rays with high penetrating power and sufficient output, a high power high-frequency power (for example, the maximum output of 3 MW and the average output of 3 kW) needs to be supplied to the accelerating tube. Hence, a high power radio frequency (RF) source such as klystron and magnetron, and a high voltage power source for driving the high power RF source are required. However, compared with the X-ray tube that produces bremsstrahlung radiation with energy of about 100 keV described above, such high power RF source and the high voltage power source are large in size, poor in portability, and not mountable on a vehicle.

The present invention has been made to solve the above problems, and an object of the present invention is to provide a radiation generation apparatus that can be downsized while improving power efficiency compared with a normal conduction accelerating tube, and a radiation generation method.

Solution to Problem

In order to achieve the object, a radiation generation apparatus according to one aspect of the present invention includes an accelerating tube in which an accelerating cavity is defined by a tubular-shaped housing having conductivity and a plurality of cells made of a dielectric material, center openings of the cells being aligned so as to be communicated with each other in a direction in which the cells are arranged in the housing; an RF amplifier that supplies a high-frequency power to the accelerating tube; and an electron gun that emits a charged particle passing through the openings of the cells in the accelerating tube.

In the radiation generation apparatus according to one aspect of the present invention, a maximum output of the RF amplifier is preferably 100 kW or less.

In the radiation generation apparatus according to one aspect of the present invention, a maximum output of the RF amplifier is preferably 10 kW or less.

The radiation generation apparatus according to one aspect of the present invention preferably further includes a control unit that controls an output power of the RF amplifier to be kept constant, and that controls an injection time ratio of the charged particle from the electron gun.

In the radiation generation apparatus according to one aspect of the present invention, it is preferable that the electron gun includes a cathode that discharges the charged particle by a cathode heater voltage, and a grid that accelerates the charged particle by a grid voltage, and the control unit controls an ON-time of the grid voltage to control the injection time ratio of the charged particle.

In the radiation generation apparatus according to one aspect of the present invention, it is preferable that the electron gun includes a cathode that discharges the charged particle by a cathode heater voltage, and an anode that collects an electron discharged from the cathode by a potential difference between the cathode and the anode to turn the electron into an electron beam, and the control unit controls an ON-time of voltage to be applied between the cathode and the anode to control the injection time ratio of the charged particle.

In order to achieve the object, a radiation generation method according to one aspect of the present invention includes, by using an accelerating tube in which an accelerating cavity is defined by a tubular-shaped housing having conductivity and a plurality of cells made of a dielectric material, center openings of the cells being aligned so as to be communicated with each other in a direction in which the cells are arranged in the housing, an RF amplifier that supplies a high-frequency power to the accelerating tube, and an electron gun that emits a charged particle passing through the openings of the cells in the accelerating tube, changing an injection time ratio of the charged particle from the electron gun, while keeping an output power of the RF amplifier constant.

Advantageous Effects of Invention

In the present invention, an accelerating tube capable of obtaining a Q value about several times to ten times higher than that of a generally used normal conduction accelerating tube using a resonant cavity made of oxygen-free copper is used. Consequently, with the present invention, it is possible to improve the power efficiency, and obtain X-rays with high energy and high output. Then, even when an RF amplifier and a relatively low voltage power source for driving the RF amplifier are used instead of a high power RF source such as klystron and magnetron, and a high voltage power source for driving the high power RF source, the present invention can obtain X-rays with high energy and high output than when the normal conduction accelerating tube is used. Consequently, with the present invention, compared with when the high power RF source and the high voltage power source described above are used, it is possible to downsize and improve the portability so as to be mountable on a vehicle. That is to say, the present invention can simplify the power source configuration at a high power efficiency.

DESCRIPTION OF EMBODIMENTS

Hereinafter, an embodiment according to the present invention will be described in detail with reference to the accompanying drawings. It is to be noted that the present invention is not limited to the embodiment. Components in the following embodiment include components that can be easily replaced by those skilled in the art, or components substantially the same as those components.

Figure 1:
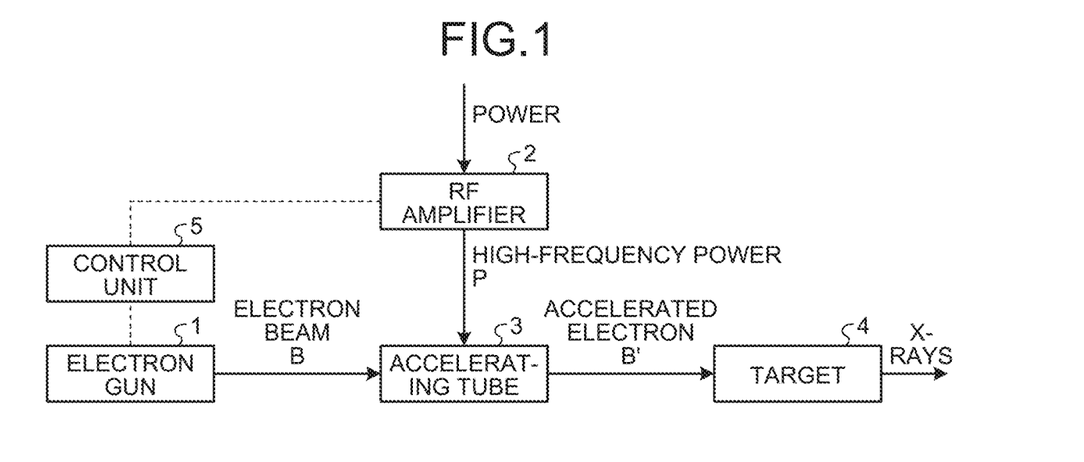
FIG. 1 is a schematic configuration diagram illustrating a radiation generation apparatus according to an embodiment of the present invention.
Figure 2:
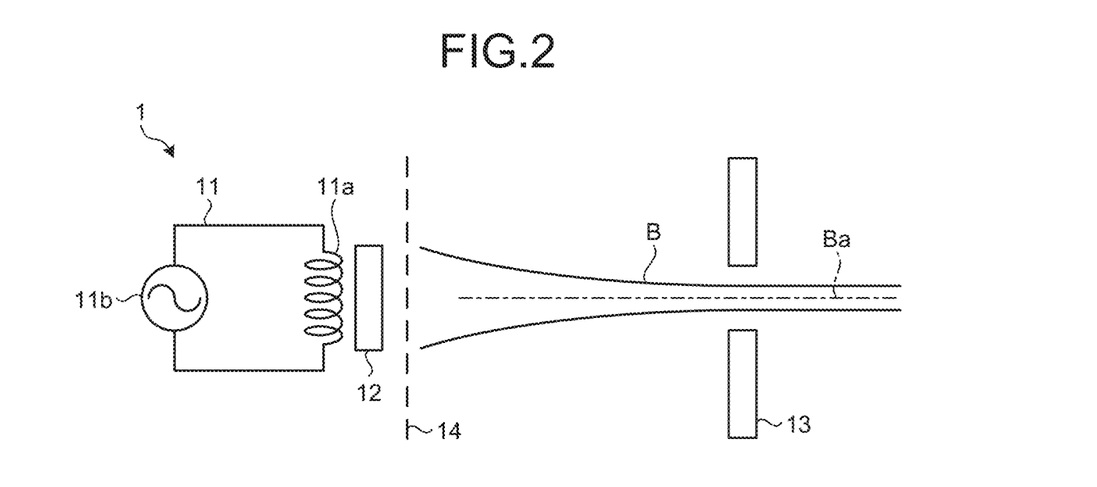
FIG. 2 is a schematic configuration diagram illustrating an electron gun of the radiation generation apparatus according to the embodiment of the present invention.
Figure 3:
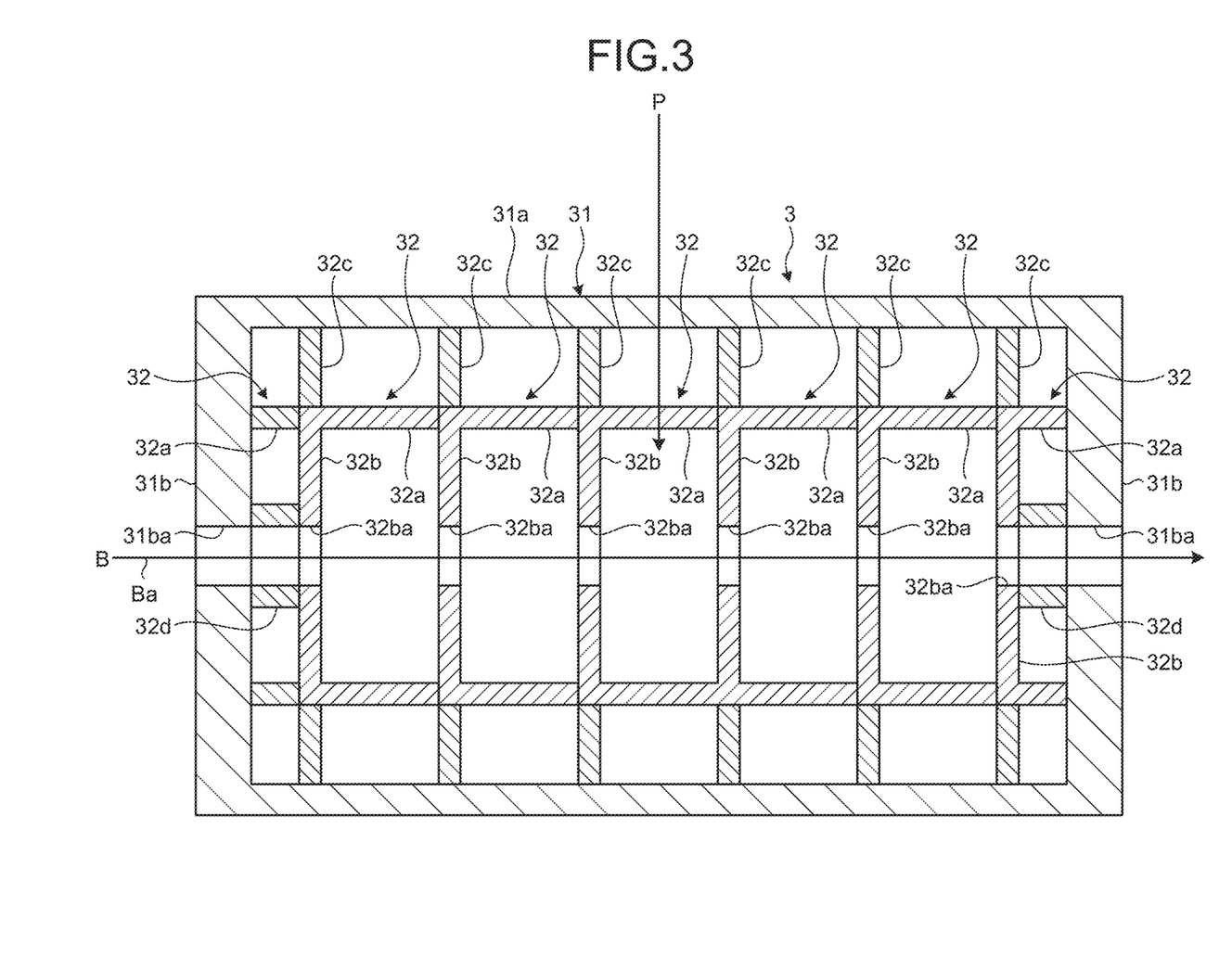
FIG. 3 is a schematic configuration diagram illustrating an accelerating tube of the radiation generation apparatus according to the embodiment of the present invention.
Figure 4:
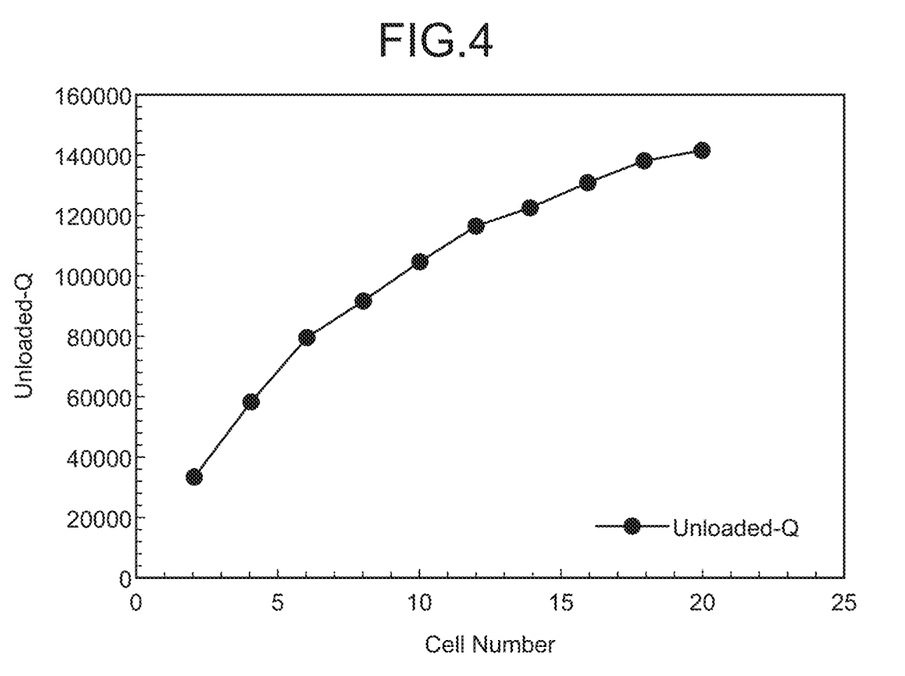
FIG. 4 is a graph illustrating a relation between the number of cells in the accelerating tube and an uncharged Q value.

FIG. 1 is a schematic configuration diagram illustrating a radiation generation apparatus according to the present embodiment. FIG. 2 is a schematic configuration diagram illustrating an electron gun of the radiation generation apparatus according to the present embodiment. FIG. 3 is a schematic configuration diagram illustrating an accelerating tube of the radiation generation apparatus according to the present embodiment. FIG. 4 is a graph illustrating a relation between the number of cells in the accelerating tube and an uncharged Q value.

A radiation generation apparatus illustrated in FIG. 1 generates X-rays, which are a type of radiation. The radiation generation apparatus includes an electron gun 1, a radio frequency (RF) amplifier 2, an accelerating tube 3, a target 4, and a control unit 5.

As illustrated in FIG. 2, the electron gun 1 includes a heater 11, a cathode 12, an anode 13, and a grid 14. The heater 11 heats the cathode 12, and is configured of a filament 11a and a power source 11b for applying voltage to the filament 11a. By being heated by the heater 11, the cathode 12 emits electrons (charged particles) from a surface on the side opposite to the heater 11. By the potential difference between the cathode 12 and the anode 13, the anode 13 collects and emits the electrons (charged particles) discharged from the cathode 12, and turns the electrons into an electron beam B. In response to the application of positive and negative voltages, the grid 14 allows the electrons emitted from the cathode 12 to be collected by the anode 13, or prevent the electrons from being collected by the anode 13. The electron beam B extracted from the electron gun 1 is injected into the accelerating tube 3.

The RF amplifier 2 supplies the amplified high-frequency power (microwaves) to the accelerating tube 3. A semiconductor amplifier with a maximum output of 100 kW or less is used for the RF amplifier 2 in the present embodiment.

The accelerating tube 3 in the present embodiment defines a high-frequency accelerating cavity (accelerating cavity) illustrated in FIG. 3. The accelerating tube 3 supplies a high-frequency power to the high-frequency accelerating cavity from the RF amplifier 2, and accelerates the electron beam B injected into the high-frequency accelerating cavity from the electron gun 1. The accelerating tube 3 that defines the high-frequency accelerating cavity includes a cylinder-shaped housing 31, and a plurality of cells 32 made of a dielectric material disposed in the housing 31.

The housing 31 includes a cylinder-shaped cylindrical part 31a, and a disk-shaped end plate 31b provided on both end sides of the cylindrical part 31a. For example, the housing 31 is a metal material with high conductivity including pure metal such as oxygen-free copper, a material such as stainless steel plated with silver or copper, and the like. Alternatively, in some cases, a dielectric material such as silver-plated ceramics or copper-plated ceramics may also be used for the housing 31. By using the metal material or the dielectric material plated with metal such as above, the surface of the housing 31 becomes conductive. A round-shaped opening 31ba is formed on the center of each of the disk-shaped end plates 31b. The electron beam B passes through the opening 31ba.

In the housing 31, the cells 32 are linearly disposed in the extending direction of a beam axis Ba of the electron beam B, from the end plate 31b on one side of the housing 31 to the end plate 31b on the other side of the housing 31. Each of the cells 32 includes a cylindrical part 32a, a disk part 32b, and an annular part 32c.

The cylindrical part 32a, the disk part 32b, and the annular part 32c are dielectric materials, and are used without applying a metal coating or the like to the surface. The dielectric material used for the cells 32 is a dielectric material with low dielectric loss such as ceramics including alumina and sapphire. In the present embodiment, for example, tan δ (dielectric tangent), which is an index representing the dielectric loss of the dielectric material used for the cells 32, is within a range of $1 \times 10^{-3}$ or less.

As a dielectric material with low dielectric loss, there is an example of developing ceramics (high-purity alumina) with low dielectric loss of about $7.5 \times 10^{-6}$ at room temperature (Applied Physics Letters (U.S.), 2002, Vol. 81. No. 26, p. 5021-5023). Moreover, for example, in the previous studies on the high-frequency characteristics of low-loss dielectrics, there is an experimental result that tan δ of sapphire is proportional to temperature T[K]5, and when it is tan δ=$10^{-5}$ at room temperature, it is reduced to tan δ=$10^{-7}$ at 80K (Physics Letters A, (Netherlands), 1987, Vol. 120, No. 6, p. 300-305).

The cylinder-shaped center axis of the cylindrical part 32a is disposed on the same axis as a center axis (beam axis Ba of the electron beam B) of the cylindrical part 31a of the housing 31. The diameter of the cylindrical part 32a is smaller than the diameter of the cylindrical part 31a of the housing 31. The diameter of the cylindrical part 32a may be the same in all the cells 32, or may be different for each of the cells 32 such that the diameter on the end part side is set larger than the diameter on the middle part side. The disk part 32b is coupled to the end part of the cylindrical part 32a.

The disk part 32b is a plate-shaped member in which a round-shaped opening 32ba is formed in the center. The diameter of the opening 32ba is smaller than the diameter of the cylindrical part 32a. The opening 32ba is provided in a direction in which the cells 32 are arranged, and through which the electron beam B passes. The cylindrical part 32a is mounted on the surface of the disk part 32b in the vertical direction. Moreover, the disk part 32b is disposed on a position separated from the end plate 31b of the housing 31, and the cylindrical part 32a comes into contact with the end plate 31b. Not all the cells 32 include the cylindrical part 32a and the disk part 32b, and some cells 32 may only include the cylindrical part 32a, or may only include the disk part 32b.

The annular part 32c is provided outside the cylindrical part 32a, on the extension line of the disk part 32b provided in the cylindrical part 32a, for the convenience of manufacturing the cells 32 and for stabilizing the supporting structure. The cells 32 can couple the cylindrical part 32a to a member integrally formed with the disk part 32b and the annular part 32c. Moreover, the cells 32 can support the disk part 32b with the inner peripheral surface of the housing 31 via the annular part 32c.

In the accelerating tube 3, an electric field in the acceleration direction is formed in the vicinity of the beam axis Ba of the passing electron beam B. The disk part 32b having the opening 32ba is installed in the cylindrical part 32a such that the plate surface of the disk part 32b of the cells 32 is in the vertical direction with respect to the beam axis Ba. In this manner, it is possible to focus the acceleration electric field in the extending direction of the beam axis Ba, in the opening 32ba of the disk part 32b. Hence, it is possible to increase the shunt impedance.

The electromagnetic-field distribution of the acceleration mode excited in the accelerating tube 3 is adjusted, by adjusting the inner diameter and the outer diameter of the cylindrical part 32a of the cells 32 disposed in the housing 31, the interval between the disk parts 32b, the inner diameter of the opening 32ba of the disk part 32b, the inner diameter of the cylindrical part 31a of the housing 31, and the like. Moreover, with the cylindrical part 32a, high-frequency power can be stored around the beam axis Ba of the passing electron beam B. As a result, it is possible to reduce the high-frequency electric field generated in a direction parallel to the metal surface of the end plate 31b of the housing 31, and reduce the conduction loss on the metal surface.

For example, as illustrated in FIG. 4, in a case when five cells 32 are disposed, the Q value will be about 60,000. Hence, it is possible to obtain a Q value several times or more higher than that of the generally used normal conduction accelerating tube using a resonant cavity made of oxygen-free copper at room temperature. Consequently, the power efficiency of the accelerating tube 3 of the present embodiment becomes higher than that of the normal conduction accelerating tube at room temperature. When the normal conduction accelerating tube is made of copper, the Q value is about 10,000. FIG. 4 indicates that the Q value is increased with an increase in the number of cells 32. This is because the length of the accelerating tube 3 is increased in the extending direction of the beam axis Ba with an increase in the number of cells 32, thereby reducing the rate of energy loss in the accelerating tube 3. The calculation for obtaining the results of the Q values illustrated in FIG. 4 is carried out using the calculation program (Poisson Superfish: Los Alamos National Laboratory (http://laacg.lanl.gov/laacg/services/download_sf.phtml)).

As the calculation conditions, physical property values of the high-purity alumina described above are used for the dielectric material of the cylindrical part 32a and the disk part 32b of the cells 32, and physical property values of the oxygen-free copper are used for the metal of the housing 31. The inner diameter and the outer diameter of the cylindrical part 32a of the cells 32 and the inner diameter of the housing 31 are calculated, by changing the inner diameter and the outer diameter of the cylindrical part 32a of the cells 32, and the inner diameter of the housing 31, and by simulating the structure of the accelerating tube 3 such that the electromagnetic-field distribution of n mode of a predetermined resonant frequency is excited in the accelerating tube 3. Then, the Q value is calculated using the calculated structure. The n mode is a mode in which the resonant electric fields, the phases of which are shifted by 180 degrees, are arranged alternately, in each vacuum portion including the beam axis Ba interposed between the disk parts 32b.

The Q value is represented by the following equation:

$$Q=(2\pi f \cdot U)/(P\_loss)$$

where
U is energy of electromagnetic waves stored in the high-frequency accelerating cavity,
P_loss is energy of electromagnetic waves lost in the high-frequency accelerating cavity (per cycle of the electromagnetic waves), and
f is frequency of electromagnetic waves.

In the example of the accelerating tube 3 described above, the annular part 32c is provided on the extension line of the plate surface of the disk part 32b. However, it is not limited thereto. That is, there is no need to provide the annular part 32c for each disk part 32b, and the number of the annular part 32c may be less than that of the disk part 32b. The annular part 32c may also be provided on a position deviated from the extension line of the disk part 32b, instead of on the extension line of the disk part 32b. That is, the annular part 32c may be disposed between the inner peripheral surface of the housing 31 and the outer peripheral surface of the cylindrical part 32a so as to be able to support the cylindrical part 32a and the disk part 32b.

Moreover, in the accelerating tube 3 according to the present embodiment, a cylindrical part 32d may be provided around the beam axis Ba, in the cell 32 adjacent to the end plate 31b of the housing 31. The cylindrical part 32d has the same inner diameter as that of the opening 31ba of the end plate 31b and the opening 32ba of the disk part 32b. One end part of the cylindrical part 32d is coupled to the end plate 31b of the housing 31, and the other end part of the cylindrical part 32d is coupled to the disk part 32b. Similar to the cylindrical part 32a, the disk part 32b, and the annular part 32c, the cylindrical part 32d is a dielectric material. By further providing the cylindrical part 32d, it is possible to further reduce the high-frequency electric field generated in a direction parallel to the metal surface of the end plate 31b of the housing 31. It is possible to obtain a Q value about twice higher than a mode in which the cylindrical part 32d is not provided.

Furthermore, although not illustrated, in the cells 32 of the accelerating tube 3 according to the present embodiment, a plurality of the cylindrical parts 32a with different diameters may be provided concentrically. In this manner, in the high-frequency accelerating cavity of the accelerating tube 3, a higher-order mode may be used for the acceleration mode. As a result, it is possible to further increase the Q value. The cylindrical parts 32a with different diameters are provided as two cells 32 adjacent to the end plate 31b of the housing 31. The center axes of the cylindrical parts 32a with different diameters are disposed on the same axis, and are provided such that the diameters are gradually increased toward the end plate 31b. When the order of the acceleration mode is n, the number of the cylindrical parts 32a is n−1. That is, when the order of the acceleration mode is two, the number of the cylindrical part 32a is one. When the order of the acceleration mode is three, the number of the cylindrical parts 32a with different diameters is two. The cylindrical part 32d may also be provided in the cells 32 including the cylindrical parts 32a with different diameters.

The target 4 includes metal (liquid metal) toward which accelerated electrons B' accelerated in the accelerating tube 3 are emitted. When the accelerated electrons B' collide with the metal, bremsstrahlung radiation is produced.

For example, the control unit 5 is a computer, and can integrally control the radiation generation apparatus, by controlling the injection timing and the injection duty (injection time ratio) of the electron beam B toward the accelerating tube 3 from the electron gun 1, and by controlling the output of the high-frequency power supplied to the accelerating tube 3 from the RF amplifier 2.

As described above, the radiation generation apparatus of the present embodiment uses the accelerating tube 3 capable of obtaining a Q value about several times to ten times higher than that of the generally used normal conduction accelerating tube using a resonant cavity made of oxygen-free copper. Consequently, with the radiation generation apparatus of the present embodiment, it is possible to improve power efficiency, and obtain X-rays with high energy and high output. Then, even when the RF amplifier 2 described above and a relatively low voltage power source for driving the RF amplifier 2 are used, instead of using a high power RF source such as klystron and magnetron, and a high voltage power source for driving the high power RF source, the radiation generation apparatus of the present embodiment can obtain X-rays with high energy and high output than when the normal conduction accelerating tube is used. Consequently, with the radiation generation apparatus of the present embodiment, compared with when the high power RF source and the high voltage power source described above are used, it is possible to downsize and improve the portability so as to be mountable on a vehicle. That is to say, the radiation generation apparatus of the present embodiment can simplify the power source configuration at a high power efficiency.

In the radiation generation apparatus of the present embodiment, the electron gun 1 has a weight of 5 kg to 20 kg and a volume of about φ100 mm×200 mm to φ250 mm×500 mm. The RF amplifier 2 has a weight of 20 kg to 100 kg, the volume thereof is based on the 19 inch rack size, which is the base area, and a height of about 200 mm to 2 m. The accelerating tube 3 has a height of 30 kg to 80 kg, and a volume of about φ100 mm×300 mm to φ200 mm×800 mm. The target 4 has a weight of 5 kg to 15 kg and a volume of about φ50 mm×100 mm to φ100 mm×200 mm. The volume of the control unit 5 is about 600 mm×800 mm×1800 mm. Thus, it is possible to improve the portability so as to be mountable on a moving body such as a vehicle.

Moreover, in the radiation generation apparatus of the present embodiment, the maximum output of the RF amplifier 2 is 100 kW or less, and thus making a significant contribution to downsizing.

Furthermore, in the radiation generation apparatus of the present embodiment, the maximum output of the RF amplifier 2 is 10 kW or less, and thus making a further and significant contribution to downsizing.

Figure 5:
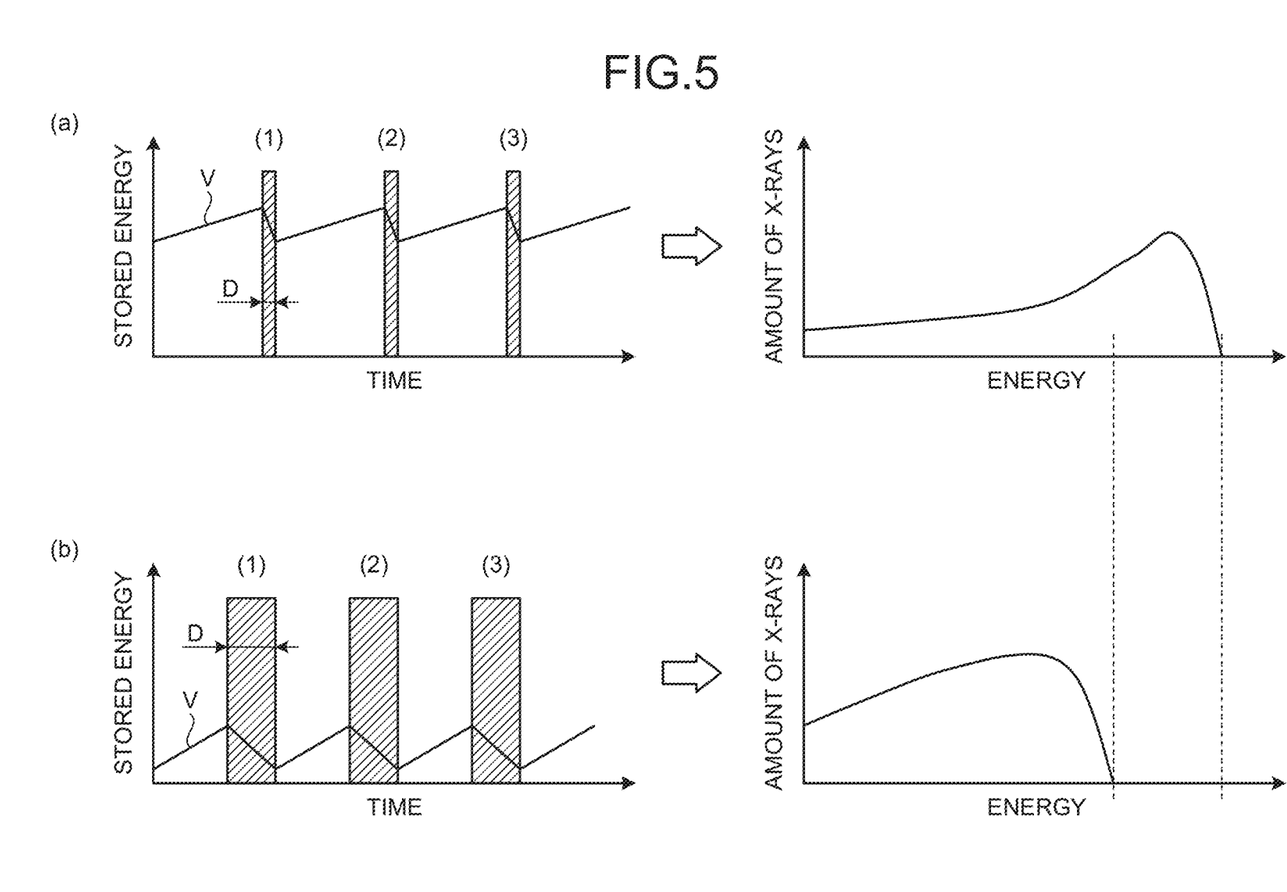
FIG. 5 is a graph illustrating an example of an operation of the radiation generation apparatus according to the embodiment of the present invention.

FIG. 5 is a graph illustrating an example of an operation of the radiation generation apparatus according to the present embodiment.

In the radiation generation apparatus of the present embodiment, the control unit 5 controls the output power of the RF amplifier 2 to be kept constant, and controls the injection duty (injection time ratio) of the electron beam B from the electron gun 1. More specifically, as illustrated in FIG. 5(a) and FIG. 5(b), when the output power of the RF amplifier 2 is kept constant, the stored energy V of the electromagnetic waves that is stored in the high-frequency accelerating cavity of the accelerating tube 3 is increased with the lapse of time. The control unit 5 injects the electron beam B from the electron gun 1 into the high-frequency accelerating cavity of the accelerating tube 3, at a timing when the stored energy V reaches a predetermined height. In FIG. 5(a) and FIG. 5(b), the injection timing of the electron beam B is indicated by (1) to (3). The electron beam B from the electron gun 1 is injected, when the grid voltage to be applied to the grid 14 is ON-OFF controlled by the control unit 5.

In FIG. 5(a), the grid voltage is controlled by reducing the injection duty D of the electron beam B from the electron gun 1 to a relatively small amount. In FIG. 5(b), the grid voltage is controlled by increasing the injection duty D of the electron beam B from the electron gun 1 to a relatively large amount. The injection duty D of the electron beam B from the electron gun 1 is controlled, by controlling the ON-time of the grid voltage to be applied to the grid 14 by the control unit 5.

As illustrated in FIG. 5(a), when the injection duty D of the electron beam B is reduced, the consumption of the stored energy V of the electromagnetic waves that is stored in the high-frequency accelerating cavity of the accelerating tube 3 becomes small by the injection duty D. Consequently, the electron beam B is injected in a state in which the higher high-frequency power is stored in the high-frequency accelerating cavity of the accelerating tube 3. Consequently, it is possible to obtain the accelerated electrons B' with high energy, and change the energy of the X-rays to be relatively large.

On the other hand, as illustrated in FIG. 5(b), when the injection duty D of the electron beam B is increased, the consumption of the stored energy V of the electromagnetic waves that is stored in the high-frequency accelerating cavity of the accelerating tube 3 becomes large by the injection duty D. Consequently, the electron beam B is injected in a state in which the high-frequency power is prevented from being stored in the high-frequency accelerating cavity of the accelerating tube 3.

Consequently, it is possible to obtain the accelerated electrons B' with low energy, and change the energy of the X-rays to be relatively small. In the case of FIG. 5(*b*), the energy of the accelerated electrons B' is reduced, but the average current is increased.

In this manner, the radiation generation apparatus of the present embodiment includes the control unit 5 that controls the output power of the RF amplifier 2 to be kept constant, and that controls the injection time ratio of the electron beam B from the electron gun 1. Moreover, in a radiation generation method of the present embodiment, the injection time ratio of the electron beam B from the electron gun 1 is changed, while keeping the output power of the RF amplifier 2 constant.

Thus, it is possible to change the energy of the accelerated electrons B' accelerated in the accelerating tube 3, and change the energy of the X-rays produced in the target 4. That is to say, it is possible to change the energy of X-rays according to an object to be inspected and the usage, while keeping the output power of the RF amplifier 2 constant.

Moreover, in the radiation generation apparatus of the present embodiment, it is preferable to control the injection time ratio of the electron beam B, by controlling the ON-time of the voltage of the grid 14 of the electron gun 1 by the control unit 5.

In the electron gun 1, as described above, electrons are emitted when the cathode 12 is heated by the heater 11. Hence, the injection time ratio of the electron beam B can be controlled, by controlling the ratio of time during which the power source 11*b* that applies voltage to the filament 11*a* of the heater 11 is turned ON by the ON-OFF control. However, it takes time to stabilize the electron emission amount, because the electrons are emitted by heating. In this respect, when the voltage of the grid 14 is ON-OFF controlled, it is possible to control the collection of the electrons, which are emitted from the cathode 12, by the anode 13, and stabilize the electron emission amount. Thus, the injection duty D is changed while keeping the maximum value of the output current from the cathode 12 of the electron gun 1 constant. Consequently, the ratio of time during which the voltage is turned ON may be controlled by only controlling the timing to turn the grid voltage ON or OFF, while keeping the driving conditions (cathode heater voltage and grid voltage) of the electron gun 1 constant. Hence, it is possible to handle the fast switching of energy.

When the electron gun has a bipolar structure without the grid 14, the amount of output current is adjusted by changing the temperature of the cathode 12, by the output current value of the heater power source 11*b*. Hence, it is difficult to switch the current value in a short period of time. However, with the present embodiment, energy can be switched by the ratio of time during which the voltage to be applied between the cathode 12 and the anode 13 is turned ON by the ON-OFF control, while keeping the output current of the heater power source 11*b* substantially constant.

Figure 6:
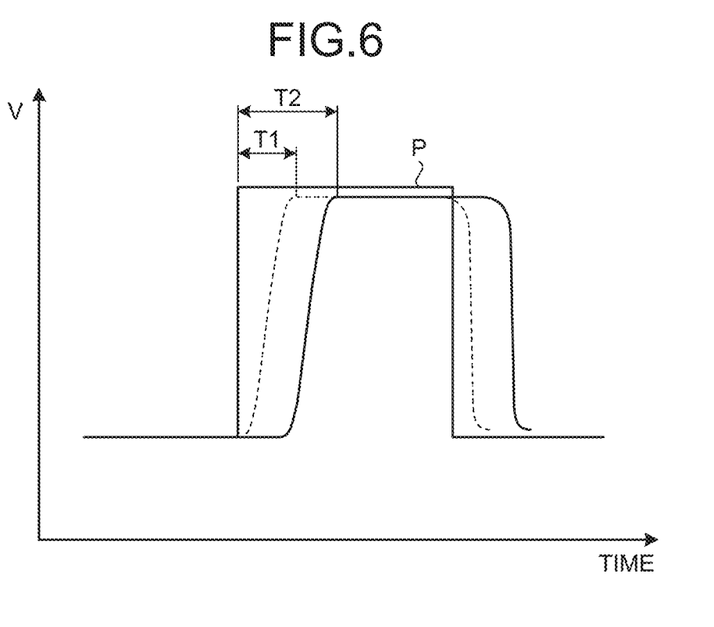
FIG. 6 is a graph illustrating an example of an operation of the radiation generation apparatus according to the embodiment of the present invention.

FIG. 6 is a graph illustrating an example of an operation of the radiation generation apparatus according to the present embodiment.

As described above, the radiation generation apparatus of the present embodiment uses the accelerating tube 3 capable of obtaining a Q value about several times to ten times higher than that of the generally used normal conduction accelerating tube using a resonant cavity made of oxygen-free copper.

FIG. 6 illustrates the filling time of the stored energy V to a predetermined level, from when high-frequency voltage P having a predetermined pulse is started to be applied to the accelerating tube. In FIG. 6, the high-frequency voltage P is applied at a predetermined pulse. In FIG. 6, filling time T1 of the normal conduction accelerating tube after the high-frequency voltage P is applied, is illustrated by a broken line. Moreover, in FIG. 6, filling time T2 of the accelerating tube 3 of the present embodiment after the high-frequency voltage P is applied, is illustrated by a solid line. For example, the filling time T1 of the normal conduction accelerating tube is 1 μs or less. However, for example, the filling time T2 of the accelerating tube 3 of the present embodiment is a several μs or more, and is longer. Thus, the timing to turn the grid voltage ON or OFF can be easily controlled, at the point when the stored energy V is stored to the maximum. As a result, when the voltage of the grid 14 of the electron gun 1 is ON-OFF controlled, the injection duty D of the electron beam B can be controlled easily.

REFERENCE SIGNS LIST 1 electron gun
11 heater
11*a* filament
11*b* power source
12 cathode
13 anode
14 grid
2 RF amplifier
3 accelerating tube
31 housing
31*a* cylindrical part
31*b* end plate
31*ba* opening
32 cell
32*a* cylindrical part
32*b* disk part
32*ba* opening
32*c* annular part
32*d* cylindrical part
4 target
5 control unit

The invention claimed is:

1. A radiation generation apparatus, comprising:
an accelerating tube in which an accelerating cavity is defined by a tubular-shaped housing having conductivity and a plurality of cells made of a dielectric material, center openings of the cells being aligned so as to be communicated with each other in a direction in which the cells are arranged in the housing;
an RF amplifier that supplies a high-frequency power to the accelerating tube;
an electron gun that emits charged particles passing through the openings of the cells in the accelerating tube; and
a control unit that
(1) controls an output power of the RF amplifier to be kept constant,
(2) increases electromagnetic wave energy (V) in the accelerating tube (3) with a lapse of time until the charged particles (B) are injected into the accelerating tube (3), and
(3) changes energy of the accelerated charged particles (B') accelerated in the accelerating tube (3) by adjusting a consumption of the stored electromagnetic wave energy (V) in the accelerating tube (3) by controlling an injection time ratio (D) of the charged particles (B) from the electron gun (1).

2. The radiation generation apparatus according to claim 1, wherein a maximum output of the RF amplifier is 100 kW or less.

3. The radiation generation apparatus according to claim 1, wherein a maximum output of the RF amplifier is 10 kW or less.

4. The radiation generation apparatus according to claim 1, wherein
- the electron gun includes
  - a cathode that discharges the charged particles by a cathode heater voltage, and
  - a grid that accelerates the charged particles by a grid voltage, and
- the control unit controls an ON-time of the grid voltage while keeping the cathode heater voltage and the grid voltage constant to control the injection time ratio of the charged particles.

5. The radiation generation apparatus according to claim 1, wherein
- the electron gun includes
  - a cathode that discharges the charged particles by a cathode heater voltage, and
  - an anode that collects an electron discharged from the cathode by a potential difference between the cathode and the anode to turn the electron into an electron beam, and
- the control unit controls an ON-time of voltage to be applied between the cathode and the anode while keeping the cathode heater voltage constant to control the injection time ratio of the charged particles.

6. A radiation generation method, comprising:

by using
- an accelerating tube in which an accelerating cavity is defined by a tubular-shaped housing having conductivity and a plurality of cells made of a dielectric material, center openings of the cells being aligned so as to be communicated with each other in a direction in which the cells are arranged in the housing,
- an RF amplifier that supplies a high-frequency power to the accelerating tube, and
- an electron gun that emits charged particles passing through the openings of the cells in the accelerating tube, (1) keeping an output power of the RF amplifier constant, (2) increasing electromagnetic wave energy (V) in the accelerating tube (3) with a lapse of time until the charged particles (B) are injected into the accelerating tube (3), and (3) changes energy of the accelerated charged particles (B') accelerated in the accelerating tube (3) by adjusting a consumption of the stored electromagnetic wave energy (V) in the accelerating tube (3) by changing an injection time ratio of the charged particles from the electron gun.

* * * * *